(12) United States Patent
Hsiao et al.

(10) Patent No.: US 10,727,113 B2
(45) Date of Patent: Jul. 28, 2020

(54) METHODS OF FORMING METAL LAYER STRUCTURES IN SEMICONDUCTOR DEVICES

(71) Applicant: Taiwan Semiconductor Manufacturing Co., Ltd., Hsinchu (TW)

(72) Inventors: Ethan Hsiao, Hisnchu (TW); Chien Wen Lai, Hsinchu (TW); Chih-Ming Lai, Hsinchu (TW); Yi-Hsiung Lin, Hsinchu County (TW); Cheng-Chi Chuang, New Taipei (TW); Hsin-Ping Chen, Hsinchu (TW); Ru-Gun Liu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/704,195

(22) Filed: Dec. 5, 2019

(65) Prior Publication Data
US 2020/0111702 A1 Apr. 9, 2020

Related U.S. Application Data

(63) Continuation of application No. 15/993,691, filed on May 31, 2018, now Pat. No. 10,504,775.

(51) Int. Cl.
*H01L 21/768* (2006.01)
*H01L 21/33* (2006.01)
(Continued)

(52) U.S. Cl.
CPC .... *H01L 21/76816* (2013.01); *H01L 21/0276* (2013.01); *H01L 21/0332* (2013.01);
(Continued)

(58) Field of Classification Search
CPC ........... H01L 21/76816; H01L 21/0332; H01L 21/76877; H01L 21/0276; H01L 21/0337
See application file for complete search history.

(56) References Cited

U.S. PATENT DOCUMENTS 8,669,180 B1    3/2014  Lee et al.
8,736,072 B2 *  5/2014  Wang ............... H01L 23/528
                                                                257/775

(Continued)

*Primary Examiner* — William F Kraig
*Assistant Examiner* — Khatib A Rahman
(74) *Attorney, Agent, or Firm* — Haynes and Boone, LLP

(57) ABSTRACT

A method includes providing a substrate comprising a material layer and a hard mask layer; patterning the hard mask layer to form hard mask lines; forming a spacer layer over the substrate, including over the hard mask lines, resulting in trenches defined by the spacer layer, wherein the trenches track the hard mask lines; forming a antireflective layer over the spacer layer, including over the trenches; forming an L-shaped opening in the antireflective layer, thereby exposing at least two of the trenches; filling the L-shaped opening with a fill material; etching the spacer layer to expose the hard mask lines; removing the hard mask lines; after removing the hard mask lines, transferring a pattern of the spacer layer and the fill material onto the material layer, resulting in second trenches tracking the pattern; and filling the second trenches with a conductive material.

20 Claims, 15 Drawing Sheets

(51) Int. Cl.
  *H01L 21/027* (2006.01)
  *H01L 21/033* (2006.01)
  *H01L 21/311* (2006.01)
  *H01L 21/8234* (2006.01)
  *H01L 21/3105* (2006.01)

(52) U.S. Cl.
  CPC ...... *H01L 21/0337* (2013.01); *H01L 21/0338* (2013.01); *H01L 21/31111* (2013.01); *H01L 21/31144* (2013.01); *H01L 21/76877* (2013.01); *H01L 21/823475* (2013.01); *H01L 21/31053* (2013.01); *H01L 21/823431* (2013.01)

(56) References Cited

U.S. PATENT DOCUMENTS

| | | | |
|---|---|---|---|
| 8,772,109 B2 | 7/2014 | Colinge et al. | |
| 8,785,285 B2 | 7/2014 | Tsai et al. | |
| 8,796,666 B1 | 8/2014 | Huang et al. | |
| 8,816,444 B2 | 8/2014 | Wann et al. | |
| 8,822,243 B2 | 9/2014 | Yan et al. | |
| 8,823,065 B2 | 9/2014 | Wang et al. | |
| 8,860,148 B2 | 10/2014 | Hu et al. | |
| 8,987,142 B2 | 3/2015 | Lee et al. | |
| 9,053,279 B2 | 6/2015 | Chang et al. | |
| 9,054,159 B2* | 6/2015 | Huang | H01L 21/76816 |
| 9,093,530 B2 | 7/2015 | Huang et al. | |
| 9,099,530 B2 | 8/2015 | Lin et al. | |
| 9,105,490 B2 | 8/2015 | Wang et al. | |
| 9,153,478 B2* | 10/2015 | Liu | H01L 21/76816 |
| 9,236,267 B2 | 1/2016 | De et al. | |
| 9,236,300 B2 | 1/2016 | Liaw | |
| 9,305,841 B2* | 4/2016 | Huang | H01L 21/76816 |
| 9,501,601 B2 | 11/2016 | Chang et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,876,114 B2 | 1/2018 | JangJian et al. | |
| 10,147,637 B2* | 12/2018 | Drissi | H01L 21/76802 |
| 2015/0200095 A1* | 7/2015 | Huang | H01L 21/0338 257/390 |
| 2015/0287635 A1 | 10/2015 | Huang et al. | |
| 2017/0069505 A1* | 3/2017 | Liu | H01L 21/76816 |
| 2017/0352584 A1* | 12/2017 | Yaegashi | H01L 21/31144 |
| 2018/0061658 A1* | 3/2018 | Mohanty | H01L 21/02186 |
| 2018/0226250 A1* | 8/2018 | Chen | H01L 21/76229 |
| 2018/0247814 A1* | 8/2018 | Lazzarino | H01L 21/0337 |
| 2019/0371655 A1 | 12/2019 | Hsiao et al. | |

* cited by examiner

METHODS OF FORMING METAL LAYER STRUCTURES IN SEMICONDUCTOR DEVICES

PRIORITY DATA

This is a continuation of U.S. patent application Ser. No. 15/993,691, entitled "Methods of Forming Metal Layer Structures in Semiconductor Devices," filed May 31, 2018, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Self-aligned double patterning or multiple patterning techniques are used to define conductive lines. However, the existing metal line forming techniques have tight process window and can result in the formation of relatively short dummy conductive lines that lead to increased parasitic capacitance. Accordingly, improvements in these areas are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
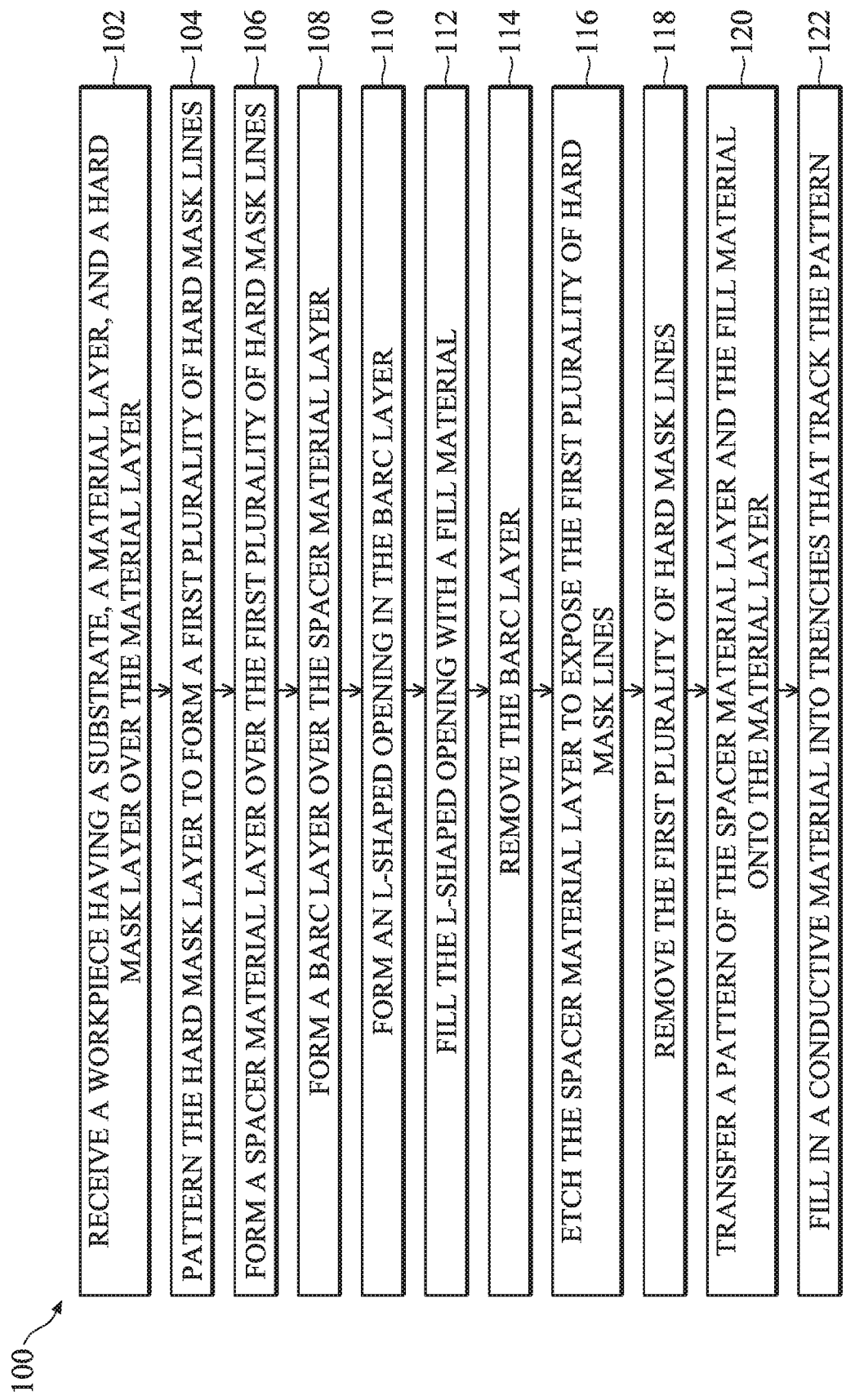
FIG. 1 is a flowchart illustrating a method for fabricating conductive features on a substrate according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable percentage (e.g., +/−10%) of the number described as understood by a person having ordinary skill in the art, unless otherwise specified. For example, the term "about 5 nm" encompasses the dimension range from 4.5 nm to 5.5 nm.

Illustrated in FIG. 1 is a method 100 of fabricating conductive features of a semiconductor device on a substrate. The method 100 is merely an example, and is not intended to limit the present disclosure beyond what is explicitly recited in the claims. Additional operation can be provided before, during, and after the method 100, and some operations can be replaced, eliminated, or moved around for additional embodiments of the method. The method 100 is described below in conjunction with FIGS. 2-15, which are perspective views of a substrate in various stages of a fabrication process. In an embodiment, the conductive features may be a part of an interconnect structure such as a multi-layer interconnect (MLI) structures.

It is also understood that parts of the semiconductor device of FIGS. 2-15 may be fabricated by complementary metal-oxide-semiconductor (CMOS) technology process flow, and thus some processes are only briefly described herein. Further, the semiconductor device may include various other devices and features, such as field effect transistors, bipolar junction transistors, resistors, capacitors, diodes, fuses, etc., but is simplified for a better understanding of the inventive concepts of the present disclosure. Furthermore, the semiconductor device of FIGS. 2-15 may be an intermediate device fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

It is also noted that the semiconductor device of FIGS. 2-15 may include multi-gate transistors or fin-type multi-gate transistors referred to herein as FinFET devices. Such a device may include a P-type FinFET device or an N-type FinFET device. The FinFET device may be a dual-gate device or a tri-gate device, built on a bulk substrate or a silicon-on-insulator (SOI) substrate. One of ordinary skill in the art may recognize other embodiments of semiconductor devices that may benefit from aspects of the present disclosure. For example, some embodiments as described herein may also be applied to gate-all-around (GAA) devices, Omega-gate (Ω-gate) devices, Pi-gate (Π-gate) devices, nano-wire gate devices, and nano-sheet gate devices. In other embodiments, a planar device may be fabricated using one or more of the structures or methods discussed herein.

The fins in FinFET semiconductor devices may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The semiconductor device of FIGS. 2-15 includes a plurality of passive and/or active components (e.g., transistors), which may be interconnected. The components may be interconnected using an interconnect structure formed according to the method 100. The interconnect structure may provide a physical and/or electrical connection between components and/or between a component and a pad providing an external connection (e.g., to a package). An interconnect structure such as an MLI structure includes a plurality of conductive lines formed in various layers (e.g., metal 1, metal 2) with conductive vias interconnecting the lines. An interconnect structure further includes one or more dielectric material (for example, interlayer dielectric (ILD) layers) to provide isolation between conductive features.

Figure 2:
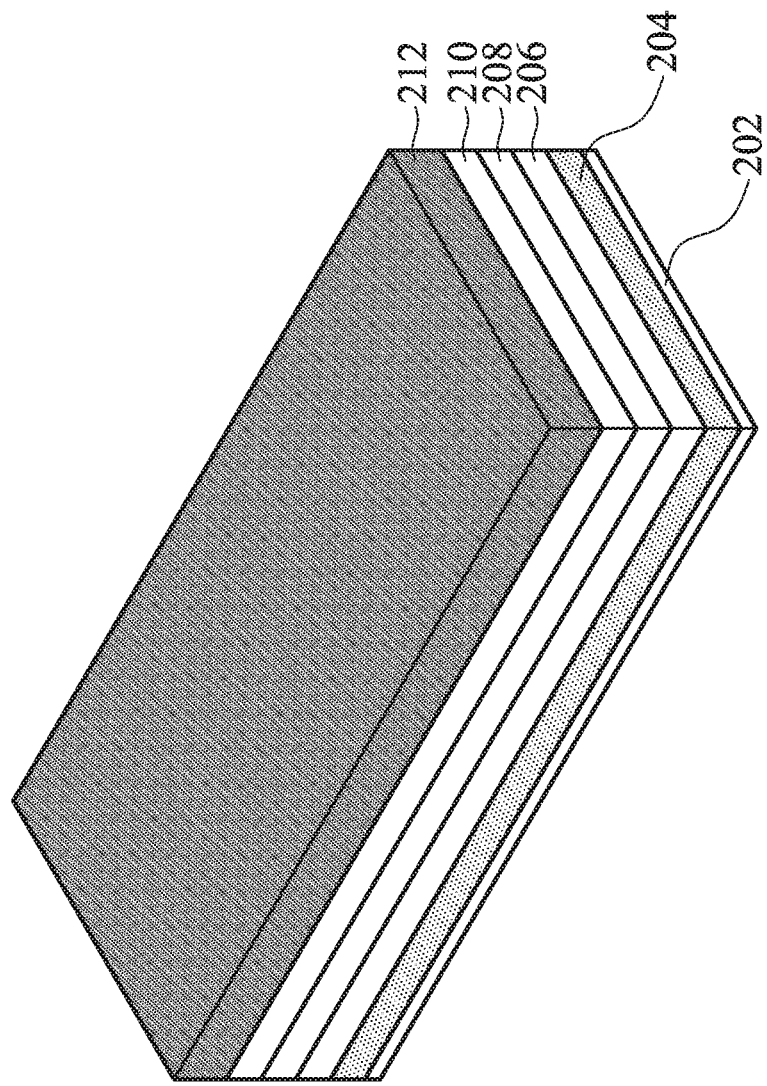
FIGS. 2, 3, 4, 5, 6, 7, 8, 9, 10, 11, 12, and 13 illustrate perspective views of a substrate that undergoes operations of the method in FIG. 1, according to aspects of the present disclosure.

At operation 102, the method 100 (FIG. 1) receives a workpiece 200 (or device 200) such as shown in FIG. 2. Referring to FIG. 2, the device 200 includes a substrate 202. The substrate 202 may be a semiconductor wafer that includes a plurality of layers. In an embodiment, the semiconductor wafer includes silicon. Alternatively, the substrate 202 may include another elementary semiconductor, such as germanium Ge; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof. In yet another alternative, the substrate 202 includes a semiconductor on insulator (SOI). Alternatively, the substrate 202 may include a non-semiconductor material such as a glass substrate, fused quartz substrate, and/or other suitable materials.

The substrate 202 may also include various features such as doped regions, dielectric features, conductive features such as multi-layer interconnects, and/or other suitable features (not shown). In one embodiment, the substrate 202 includes features forming various semiconductor devices such as, for example, complementary metal-oxide-semiconductor field effect transistors (CMOSFET), imaging sensors, capacitors, memory cells, diodes, fin-type field-effect transistors (FINFETs), and/or other suitable devices.

The device 200 includes a plurality of layers formed over the substrate 202. As illustrated, the device 200 includes a base layer 204, a dielectric layer 206, a first hard mask layer 208, an etch stop layer (ESL) 210, and a second hard mask layer 212. However, these layers are exemplary and not intended to be limiting; one or more of the layers may be omitted, and additional layers may be added. For example, one or more anti-reflective coating layers or ESL layers may be inserted between two of the layers illustrated in FIGS. 2-12. Example compositions for the layers formed on the substrate 202 are provided below, however, except as specifically defined by the claims hereto, these compositions are merely examples and not intended to be limiting.

In some embodiments, the base layer 204 includes a dielectric material such as a low-k or an extreme low-k (ELK) dielectric material. Exemplary ELK materials include dielectric materials having a dielectric constant k less than approximately 2. The base layer 204 may include dielectric materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The layer may be deposited by a plasma enhanced chemical vapor deposition (PECVD) process or other suitable deposition technique. In some embodiments, the base layer 204 may be an interlayer dielectric (ILD) layer or of a MLI structure. In some instances, metallization layer may be formed within the base layer 204.

The dielectric layer 206 may include dielectric materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the first and second hard mask layers 208 and 212 include a hard mask material, such as titanium oxide (TixOy), tantalum oxide (TaxOy), titanium nitride (TixNy), silicon nitride (SixNy), and silicon oxide (SixOy).

In some embodiments, the ESL layer 210 may be formed of a dielectric material, such as silicon carbide (SixCy), silicon nitride (SixNy), silicon oxynitride (SixOyNz), silicon oxycarbide (SixOyCz), or combination thereof. The X and Y in the chemical formulae can be stoichiometric or can depend on the amount of precursors used to form the ESL layer 210. In some embodiments, the ESL layer 210 may include multiple etch stop layers formed of aforementioned dielectric materials. Generally, as compared to the hard mask layer 212, the ESL layer 210 may experience slower etch rate in an etching process. That way, when the hard mask layer 212 is etched, the etching process can substantially come to a stop within or near a boundary of the ESL layer 210. The layers 204, 206, 208, 210, and/or 212 may be formed by suitable processes such as, for example, chemical vapor deposition (CVD) including PECVD, low-pressure CVD (LPCVD), or high density plasma CVD (HDP-CVD) process; spin-on coating; sputtering; physical vapor deposition (PVD); atomic layer deposition (ALD); and/or other suitable processes.

Figure 3:
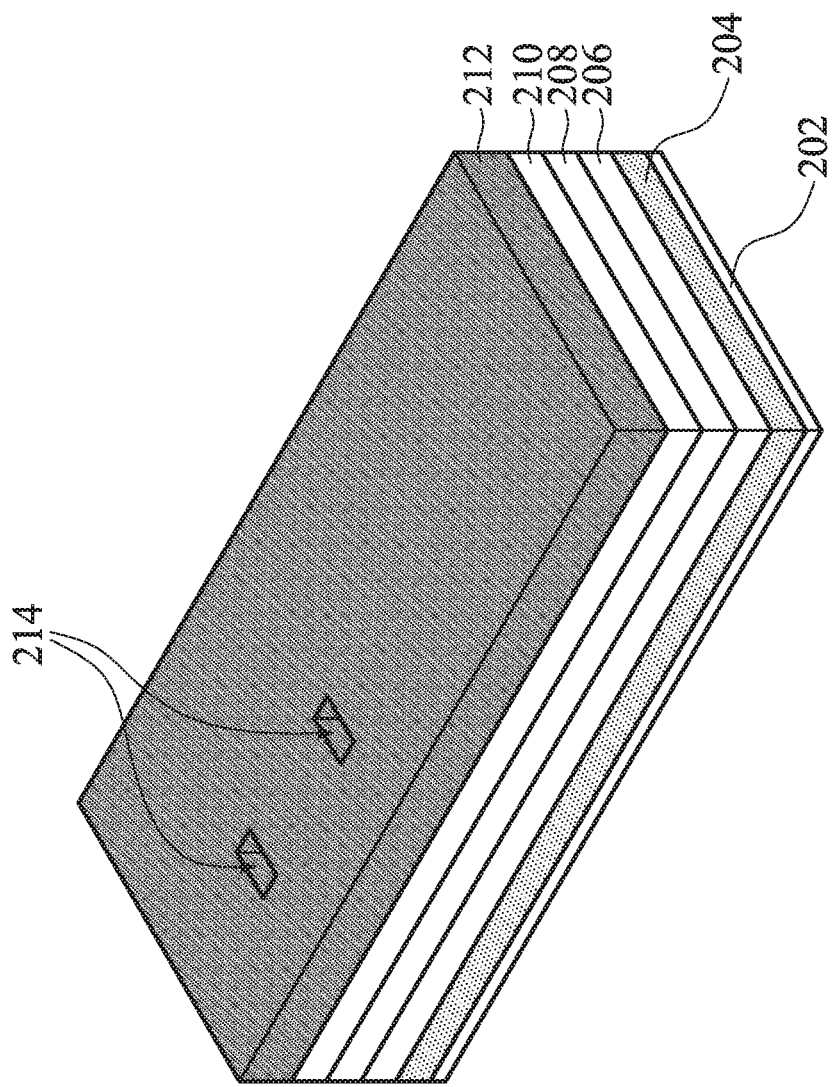
Figure 4:
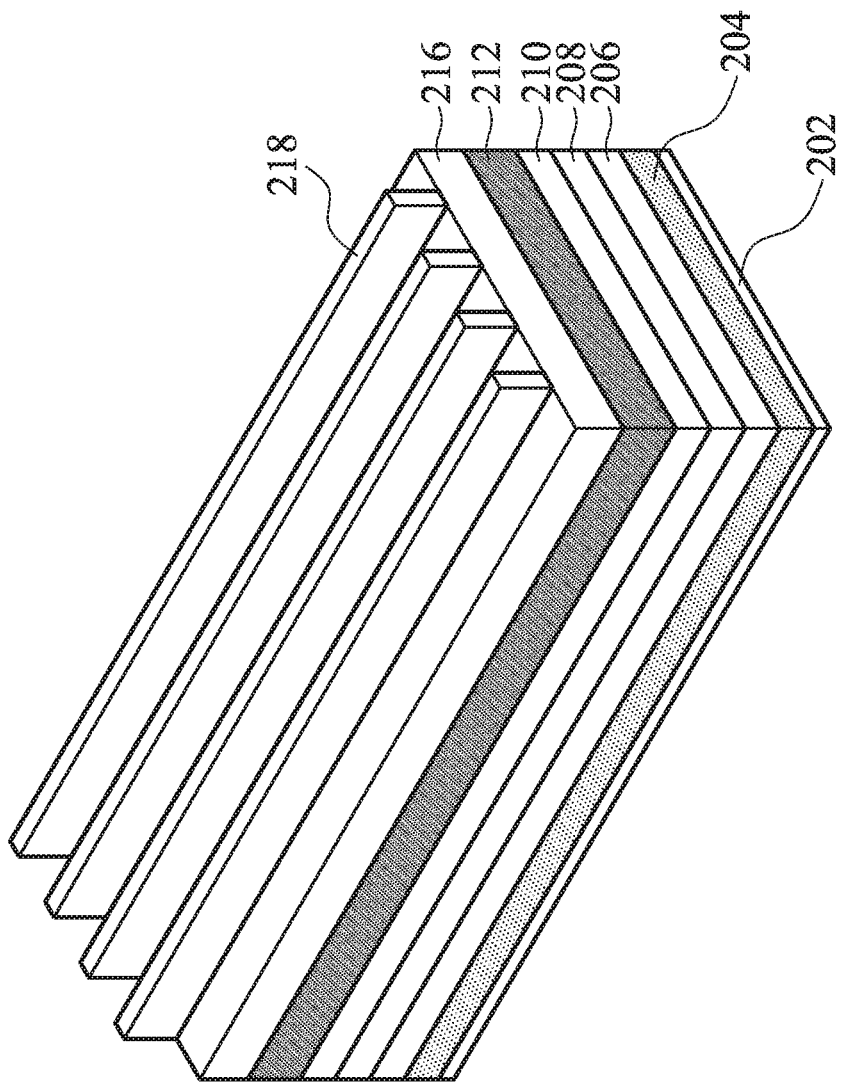
Figure 5:
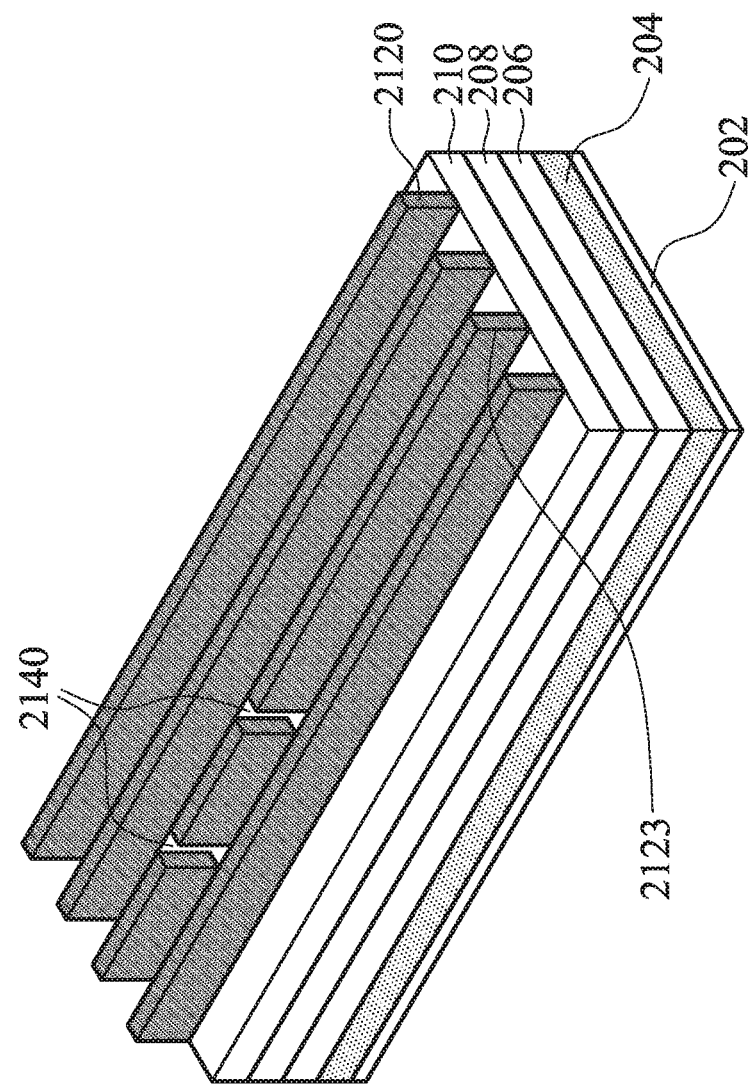

With reference now to FIGS. 3, 4, and 5, the method 100 then proceeds to block 104 to pattern the second hard mask layer 212 to form a first plurality of hard mask lines 2120. As shown in FIG. 3, in some implementations, a plurality of openings 214 may be optionally formed on the second hard mask layer 212. Each of the plurality of openings 214 extends along a direction that is perpendicular to the direction of the to-be-formed conductive features. In the embodiment represented in FIG. 3, the plurality of openings 214 extend along the Y direction. One-directional openings such as opening 214 can be formed with good precision. As will be described in more details in FIGS. 5, 6, 9, 10, 11, and 12, the plurality of openings 214 may result in formation of hard mask features that separate metal lines. For that reason, the formation of the plurality of openings 214 may be referred to as a first cut metal etch.

Referring now to FIG. 4, a bottom antireflective coating (BARC) 216 may be formed over the second hard mask layer 212. In some implementations, the BARC layer 216 may be formed of silicon oxynitride (SiON), a polymer, other suitable materials, or a combination thereof, using CVD, spin-on processes, or other suitable processes. Photoresist lines 218 are formed over the BARC layer 216. Each of the photoresist lines 218 extends parallel along the X direction. The photoresist lines 218 may be formed using suitable processes. For example, a photoresist layer 218 may be formed on the BARC layer 216 by spin-on coating. The photoresist layer 218 may be then be exposed and developed by suitable lithography chemistry to turn into photoresist lines 218. After the photoresist lines 218 are developed, they may be subject to post-bake processes. Then the BARC layer 216 and the second hard mask layer 212 are etched using the plurality of photoresist lines 218 as the etch mask. As shown in FIG. 5, because the ESL 210 below the second hard mask layer 212 experiences a slower etch rate than the second hard mask layer 212, the second hard mask layer 212 not under the plurality of photoresist lines 218 is removed, leaving a first plurality of hard mask lines 2120 over the ESL 210. The openings 214 in FIG. 3 leave behind hard mask line cuts 2140 in FIG. 5, dividing the hard mask line 2123 into segments.

Figure 6:
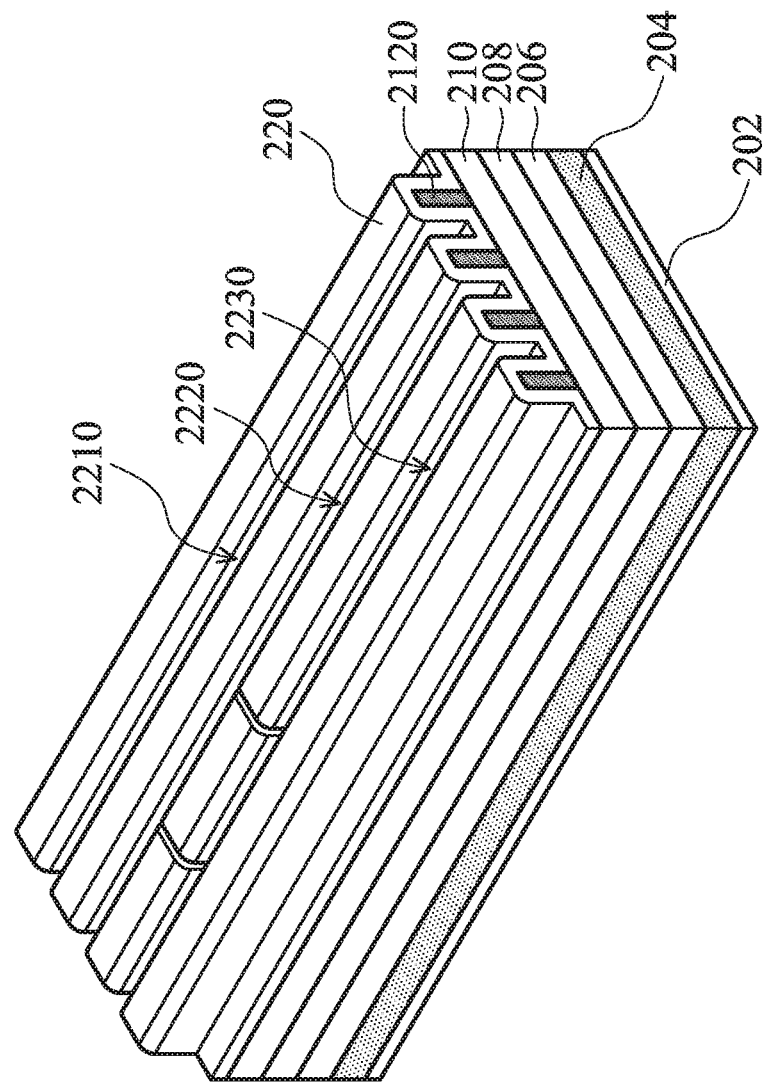

Referring now to FIG. 6, the method 100 then proceeds to block 106 where a spacer material layer 220 is formed over the first plurality of hard mask lines 2120 and the ESL 210. The spacer material layer 220 is conformally formed and may also be referred to as a conformal layer 220. As shown in FIG. 6, the spacer material layer 220 is formed not only over top surfaces of the hard mask lines 2120 but also over sidewalls of the hard mask lines 2120. As will be illustrated below in conjunction with FIG. 11, the spacer material layer 220 over the sidewalls of the hard mask lines 2120 will result in spacer layers 2200 left behind after the hard mask lines 2120 is removed from the device 200. The spacer material layer 220 may include a dielectric material, such as silicon dioxide (SixOy), silicon nitride (SixNy), silicon oxynitride (SixOyNz), and/or other suitable dielectric materials. The X and Y in the chemical formulae can be stoichiometric or can depend on the amount of precursors used to form the spacer material layer 220. It is noted that because the spacer material layer 220 is conformal in nature, it also fills in the hard mask line cuts 2140 (FIG. 5). With respect to the hard mask line 2123 where the hard mask line cuts 2140 reside, the portions of the spacer material layer 220 filled in the hard mask line cuts 2140 create spacers that divide the hard mask line 2123 into segments. As shown in FIG. 6, the spacer material layer 220 formed over the hard mask lines 2120 include spacer layer trenches 2210, 2220 and 2230.

Figure 7:
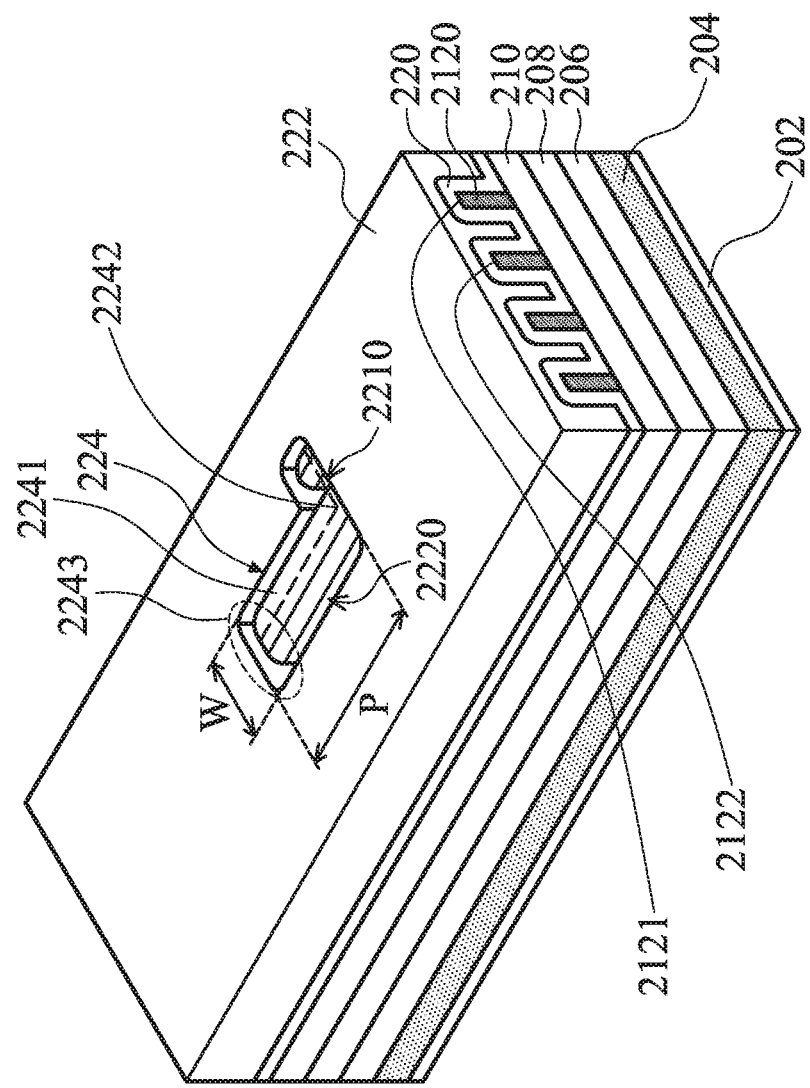

Reference is now made to FIG. 7. The method 100 of FIG. 1 proceeds to block 108 where a bottom antireflective coating (BARC) layer 222 is formed over the spacer material layer 220. In some implementations, the BARC layer 222 may be formed of silicon oxynitride (SiON), a polymer, other suitable materials, or a combination thereof, using CVD, spin-on processes, or other suitable processes. The BARC layer 222 fills in the spacer layer trenches 2210, 2220 and 2230. Still referring to FIG. 7, the method 100 then proceeds to block 110 where an L-shaped opening (or L-shaped pattern) 224 is formed by removing the BARC layer 222 within the L-shaped opening 224. To pattern the BARC layer 222 to form the L-shaped opening 224, a photoresist layer may be deposited over the BARC layer 222. The photoresist layer can be exposed and developed to have an L-shaped opening corresponding to the L-shaped opening 224 and the BARC layer 222 is etched using the photoresist layer as an etch mask. In some implementations, the L-shaped opening 224 resembles an axe and may be referred to as the axe-shaped opening 224. As will be described in more details in FIGS. 8, 9, 10, 11, 12, and 13, the L-shaped openings 224 may result in formation of fill material features that separate metal lines. For that reason, the formation of the L-shaped openings 224 may be referred to as a second cut metal etch.

In embodiments represented in FIG. 7, the L-shaped opening 224 is over the spacer layer trenches 2210 and 2220 and includes a first line-shaped portion 2241 (or first line portion 2241) and a second line-shaped portion 2242 (or second line portion 2242). In some embodiments, the first line-shaped portion 2241 is perpendicular to the second line-shaped portion 2242. In some implementations, the second line-shaped portion 2242 extends from an end of the first line-shaped portion 2241. In some instances, the first line-shaped portion 2241 extends parallel to and over the spacer layer trench 2220. In some implementations, a width W of the first line-shaped portion 2241 can have a minimum equal to a width of the spacer layer trench 2220 in order to full expose the spacer layer trench 2220. The width W of the first line-shaped portion 2241 can have a maximum equal to a pitch of the hard mask lines 2120 such that the first line-shaped opening does not expose an adjacent spacer layer trench, such as the spacer layer trench 2210. That is, edges of the first line-shaped portion 2241 that define the width W can be over the spacer material layers 220. The large range of the width W widens the process window of the method 100. In some instances, the second line-shaped portion 2242 spans over the hard mask line 2121, the hard mask line 2122, the spacer layer trenches 2210 and 2220. The first line-shaped portion 2241 includes a length P. In some instances, the device 200 includes a plurality of standard cells. Each of the standard cells includes gates of semiconductor devices that are disposed at a pitch. The pitch is substantially identical to the length P. In some embodiments, the L-shaped opening 224 may be formed using one mask that includes an L-shaped pattern that resembles the L-shaped opening 224. In some other embodiments, the L-shaped opening 224 may be formed using two separate masks: a first mask that includes a line pattern that resembles the first line-shaped portion 2241 and a second mask that includes a line pattern that resembles the second line-shaped portion 2242. While only one L-shaped opening 224 is shown in FIG. 7, multiple L-shaped openings that are substantially similar to the L-shaped opening 224 may be advantageously formed on the BARC layer 222.

While L-shaped openings are described in the present disclosure, openings of other shapes that include two line-shaped portions coupled to one another are envisioned by the present disclosure. For example, the first line-shaped portion 2241 can end in and connect to a middle portion of the second line-shaped portion 2242, thus making the L-shaped opening appear like a T-shaped opening. As used herein, the middle portion refers to any portion that is between the two terminal ends of a line-shaped portion.

In an alternative implementation, the method 100 can include additional operations between operations in block 108 and operations in block 110. These additional operations are performed by a computer system that can access a layout of the device 200. Based on the layout of the device 200, such computer system can determine locations of metal line cuts. Taking the device 200 in FIG. 7 as an example, the metal line cuts include a first metal line cut located at an end 2243 of the first line-shaped portion 2241 and a second metal line cut that coincides with the second line-shaped portion 2242. It is noted that in this example, the first metal line cut 2243 will result in a cut of a metal line to be formed under the spacer layer trench 2220 and the second metal line cut 2242 will result in a cut of two metal lines to be formed under both the spacer layer trenches 2210 and 2220. The computer system can then determine if a metal line segment between the first metal line cut 2243 and the second metal line cut 2242 (i.e. the metal line under the first line-shaped portion 2241) is functional. If the metal line segment is not functional (i.e. a dummy line), the method 100 will proceed to block 110 where the L-shaped opening will eventually result in the removal or non-formation of the dummy line under the first line-shaped portion 2241. If the computer system determines that the metal line segment between the first metal line cut 2243 and the second metal line cut 2242 is functional based on the layout of the device 200 and should not be removed, the method 100 does not apply to this specific location and only the portions of the BARC layer 222 that correspond to the first metal line cut 2243 and the second metal line cut 2242 will be removed.

Figure 8:
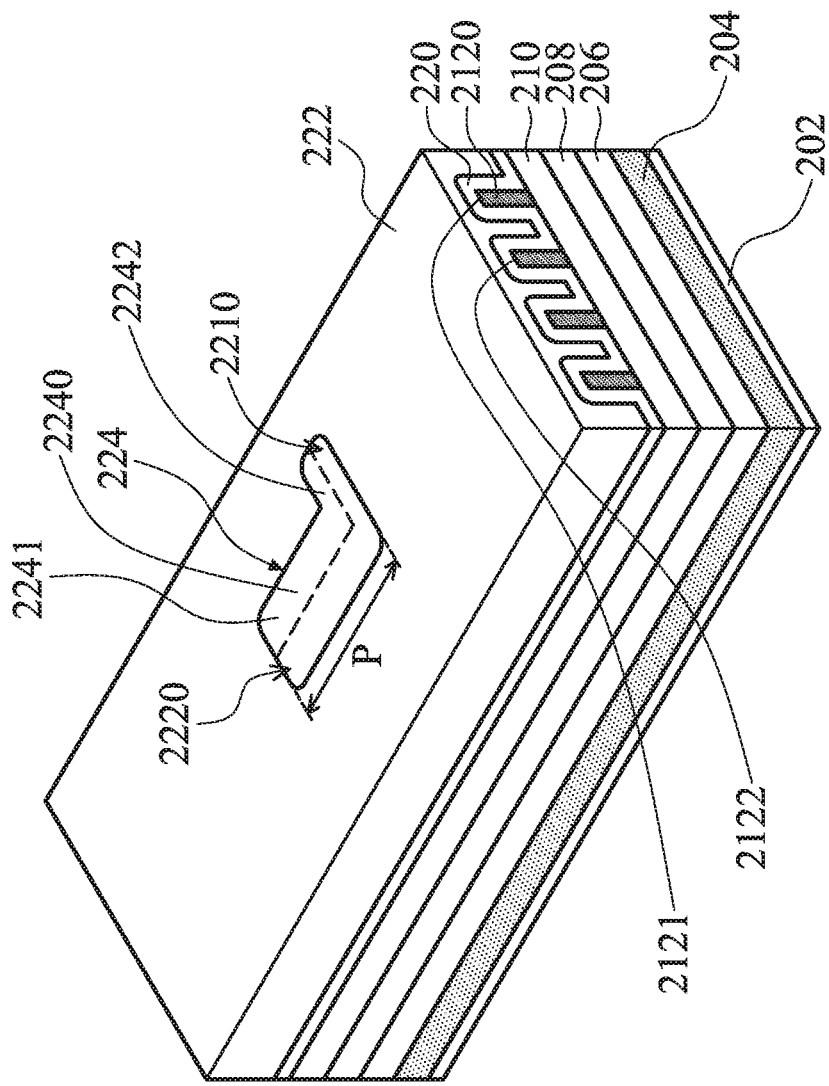

Referring to FIG. 8, the method 100 then proceeds to block 112 where the L-shaped opening 224 is filled with a fill material 2240. As illustrated in FIG. 8, the fill material 2240 not only fills in the portions of the spacer layer trenches 2210 and 2220 that are exposed in the L-shaped opening 224 but also cover the spacer material layer 220 exposed in the L-shaped opening 224. In some embodiments, the fill material 2240 may be a silicon-containing antireflective coating (Si-ARC). For example, the Si-ARC can include inorganic ARCs such as SiON, silicon containing organic ARCs such as polysilanes, and/or other suitable compositions. In an embodiment, the silicon content is between approximately 30 and 40 atomic weight percent. The spacer layer trenches 2210 and 2220 may be filled using a spin-coating or other suitable deposition process. The fill material 2240 may also be referred to as reverse material 2240.

Figure 9:
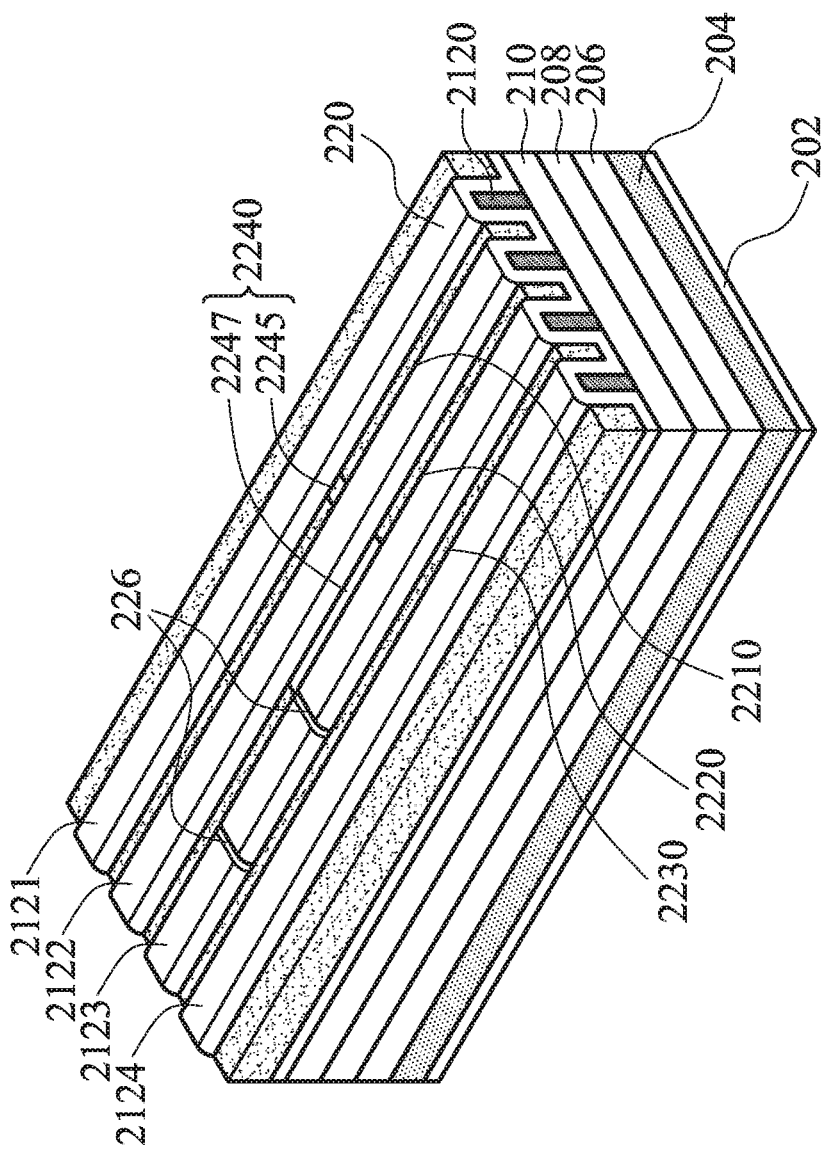
Figure 10:
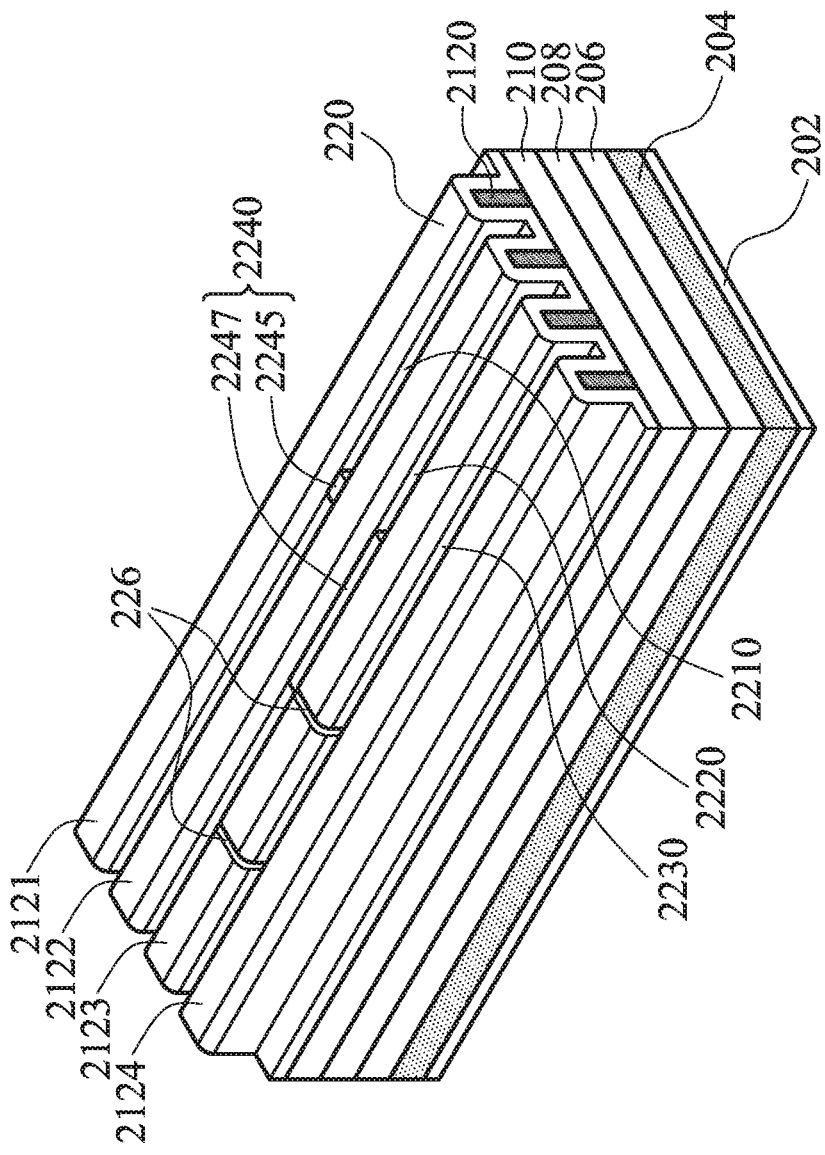

Referring to FIGS. 9 and 10, the method 100 proceeds to block 114 where the BARC layer 222 is removed. In an embodiment, after the fill material 2240 fills the L-shaped opening 224, the device 200 is planarized by, for example, the use of a chemical mechanical polishing (CMP) process. Any excess fill material 2240 that is not in the spacer layer trenches 2210 and 2220 can be removed in the planarization process, resulting in a planar surface. The resultant structure is shown in FIG. 9. In FIG. 9, the BARC layer 222 is also planarized such that a top surface of the BARC layer 222 is flush with a top surface of the plurality of spacers 2200. Referring now to FIG. 10, the planarized BARC layer 222 is then selectively etched away without substantially etching the fill material feature 2245 and 2247. In some embodiments, to achieve the etching selectivity between the BARC layer 222 and the fill material 2240, the BARC layer 222 and the fill material 2240 have different compositions. For example, the BARC layer 222 can be a polymer and the fill material 2240 can be inorganic ARC such as SiON.

Figure 11:
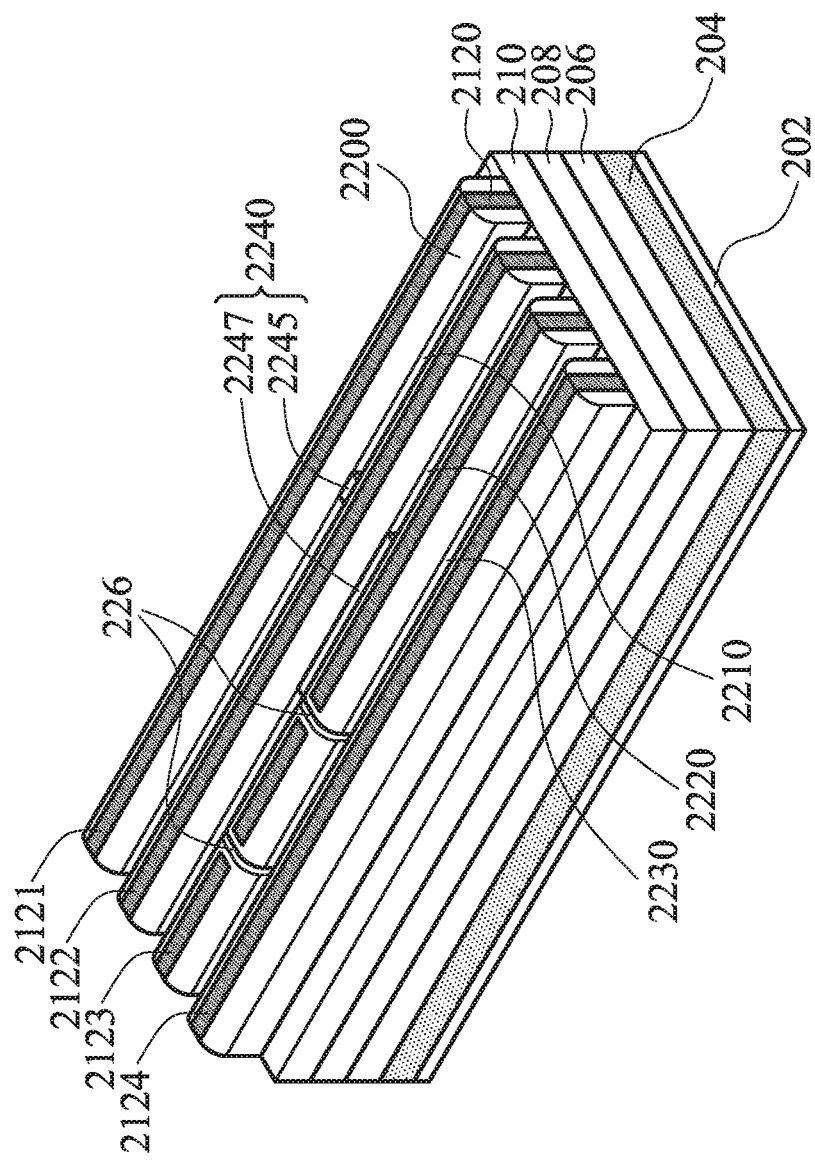

Referring now to FIG. 11, the method 100 proceeds to block 116 where the spacer material layer 220 are etched back to expose the first plurality of hard mask lines 2120. As illustrated in FIG. 11, after the portion of the spacer material layer 220 over the top surfaces of the hard mask lines 2120 is removed, the hard mask lines 2120 are exposed and a plurality of spacers 2200 over the sidewalls of the hard mask lines 2120 are formed. The spacers 2200 may be said to track the hard mask lines 2120. In some embodiments, the portion of the spacer material layer 220 on the ESL layer 210 is also removed at block 116. Also shown in FIG. 11, the hard mask line 2123 is separated by spacer material features 226 into segments. The spacers 2200 that track the hard mask lines 2120 also define spacer layer trenches 2210, 2220 and 2230. As will be made apparent by the description below, the transferred patterns of the spacer layer trenches 2210, 2220 and 2230 will be filled with conductive materials to form conductive lines.

Figure 12:
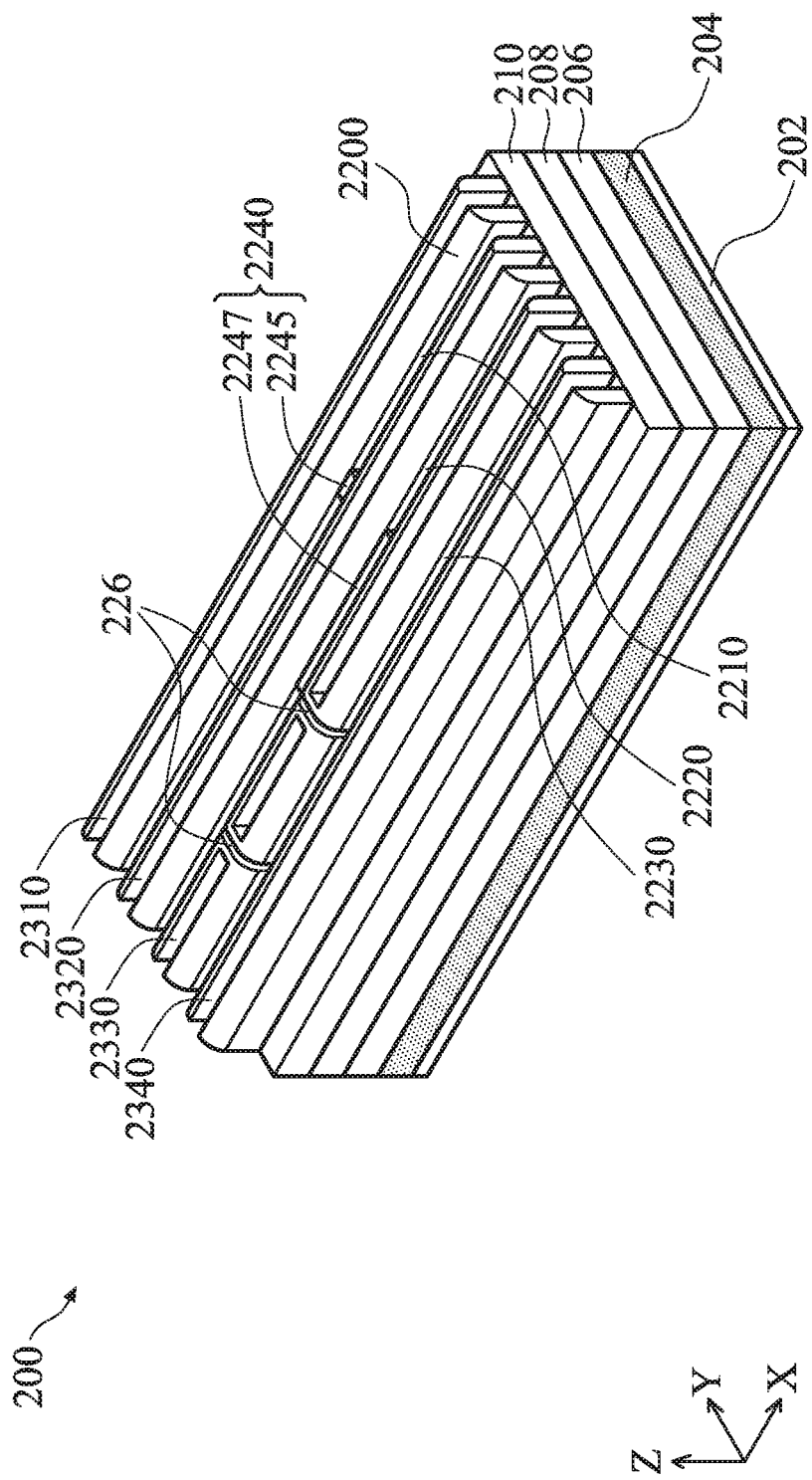

Reference is now made to FIG. 12. The method 100 proceeds to block 118 where the hard mask lines 2120 are removed or stripped off the device 200 to form trenches 2310, 2320, 2330, and 2340. This process may include an etch-back process such as a wet etch, dry etch, plasma etch, and/or other suitable process. It is noted that the material of the fill material 2240 (including fill material features 2245 and 2247) is selected to have etching selectivity with respect to the material in the hard mask lines 2121, 2122, 2123, and 2124 in FIG. 11. This etching selectivity between the hard mask material and the fill material ensures that hard mask material is preferentially etched away while the fill material is not substantially etched. Upon completion of the operation in block 118, the spacers 2200 define not only spacer layer trenches 2210, 2220 and 2230 but also trenches 2310, 2320, 2330, and 2340. Out of these trenches, spacer layer trench 2210 is divided by the fill material feature 2245 into two segments; spacer layer trench 2220 is divided by the fill material feature 2247 into two segments; and trench 2330 is divided by the spacer material features 226 into three segments. These trenches represent the pattern of conductive lines once all operations in method 100 are carried out.

Figure 13:
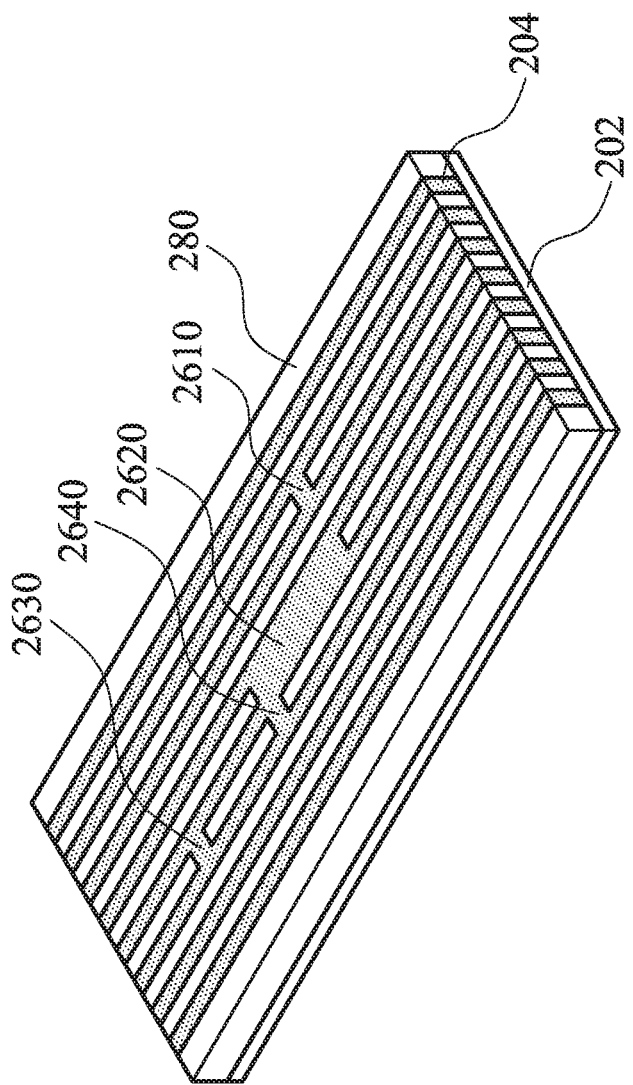

Referring now to FIG. 13, the method 100 in FIG. 1 proceeds to blocks 120 and 122. At block 120, a pattern of the spacers 2200 and the fill material 2240 (including fill material features 2245 and 2247) is transferred onto an underlying layer, such as the base layer 204. The transferred pattern in the base layer 204 may be used to define a conductive layer (e.g., metal line) of an interconnect structure such as by a damascene or dual-damascene process. In some embodiments, to perform the operations in block 120, the base layer 204 is anisotropically etched using the spacers 2200 and the fill material 2240 as an etch mask. At block 120, a conductive material 280 may then be filled or plated into the trenches in the base layer 204. In some embodiments, the workpiece 200 (device 200) is subject to a planarization process, such as a CMP process, to planarize the top surfaces of the conductive materials 280 filled in the trenches of the base layer 204. The trenches in the base layer 204 track the pattern of the spacers 2200 and the fill material 2240. Particularly, as shown in FIG. 13, the metal line cut 2610 correspond to the fill material feature 2245, the metal line cut 2620 corresponds to the fill material feature 2247, and the metal line cuts 2630 and 2640 correspond to the spacer material features 226. In some embodiments, the conductive material formed in the trenches includes copper (Cu). However, other exemplary embodiments include conductive materials such as aluminum (Al), copper alloys, tungsten (W), and/or other suitable materials. The anisotropic etching processes used to transfer the pattern onto the base layer 204 may include dry etch, or plasma etch processes. Compared to certain techniques where the fill material features divide the spacer layer trench 2220 into three segments (as opposed to two segments divided by the fill material feature 2247 in the present disclosure), the metal line cut 2620 of the present disclosure removes a short segment of conductive line formed within the area of the metal line cut 2620. In some instances, such a short conductive line segment can act as a dummy metal line between two adjacent gates of a semiconductor device in a standard cell. Such a dummy metal line may reduce the performance of the semiconductor device, such as the switching speed of the semiconductor device, for example, by increasing parasitic capacitance to nearby conductive features.

Figure 14:
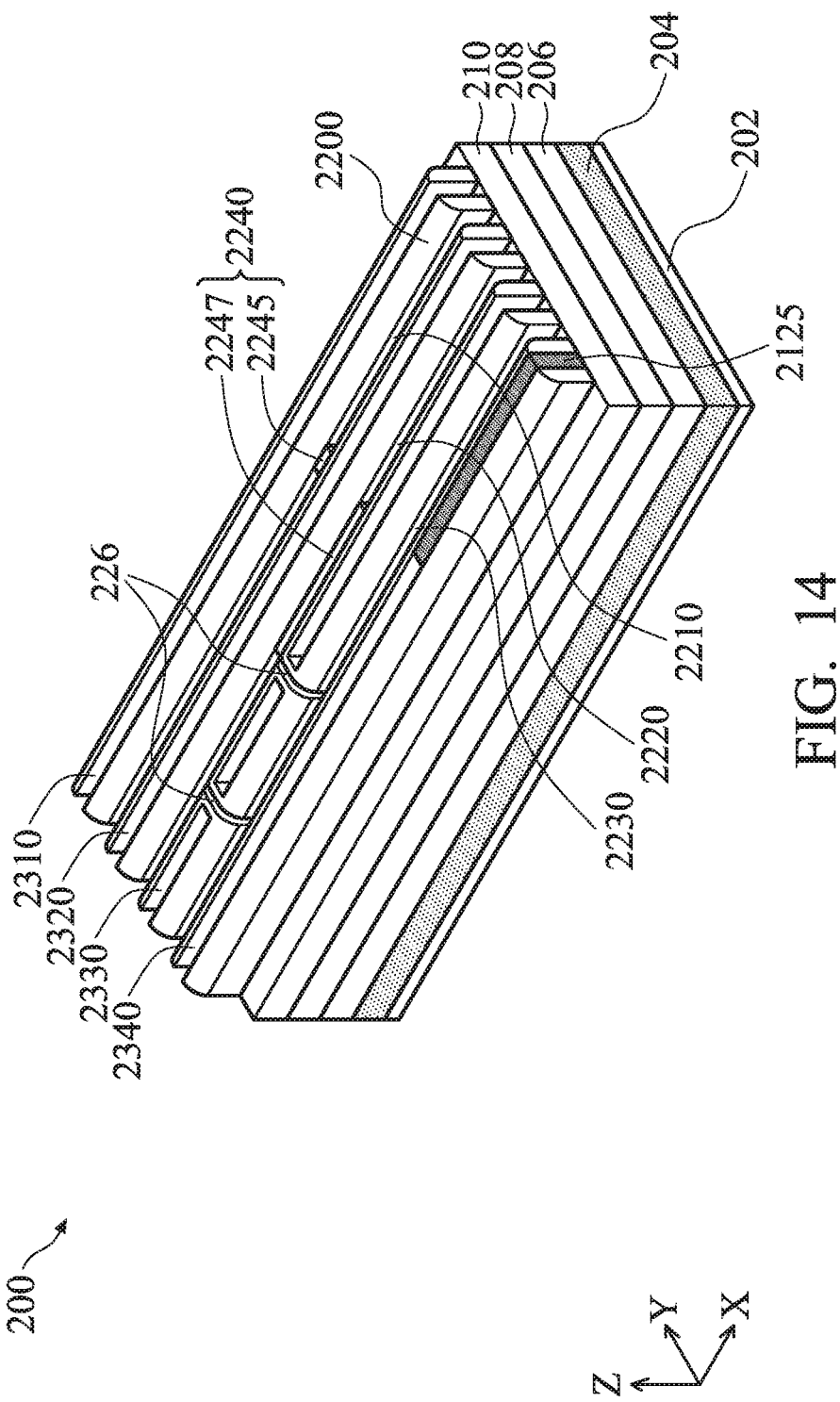
FIGS. 14 and 15 illustrate perspective views of a substrate that undergoes operations of the method in FIG. 1, according to another aspect of the present disclosure.
Figure 15:
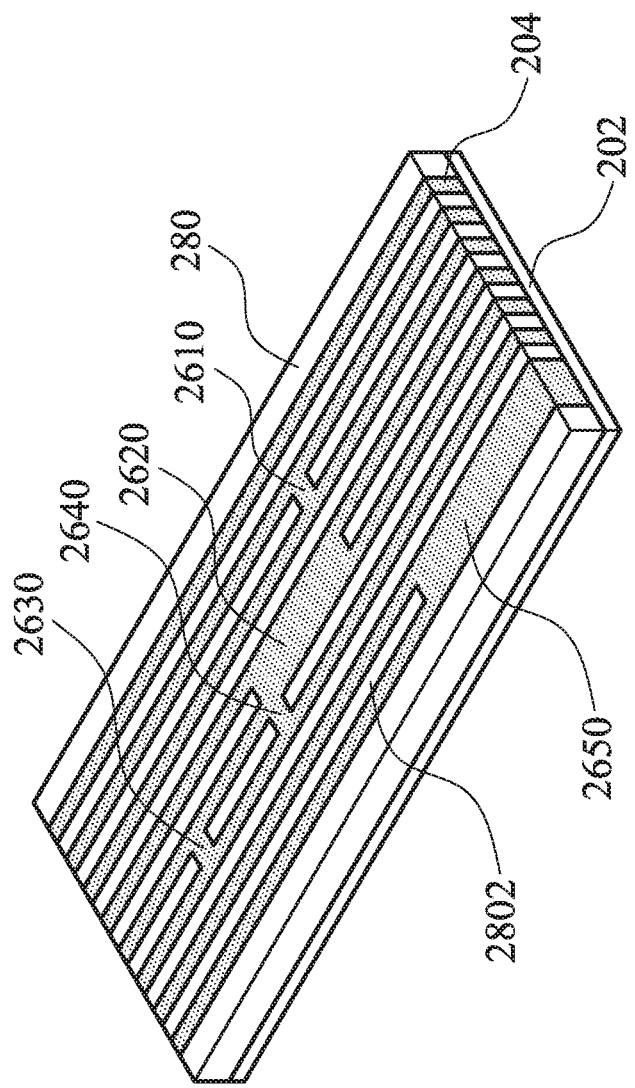

Referring now to FIG. 14, in some embodiments, only a portion of the hard mask line 2124 in FIG. 11 is removed and a leftover segment 2125 of the hard mask line 2124 is left in the trench 2340 in FIG. 14. In those embodiments, the trench 2340 may be shortened by the leftover hard mask segment 2125. Because the trench 2340 represents a conductive line to be formed, shortening of the trench 2340 also shortens the resulting conductive line. Referring now to FIG. 15, the pattern of the spacer layer 2200, the leftover hard mask segment 2125 and the fill material features 2240 are transferred to the base layer 204. The leftover hard mask segment 2125 can result in a base layer segment 2650 to be formed. The base layer segment 2650 cuts short the conductive metal line 2802. This partial hard mask line removal process can be an alternative to the first metal cut etch process described above.

By forming the L-shaped opening 224 in block 110, the method 100 of the present disclosure not only widens the process window but also eliminates dummy conductive lines that may affect the performance of the semiconductor device. As shown in FIG. 7, the first line-shaped portion 2241 of the L-shaped opening 224 can be substantially wider than the spacer layer trench 2220. The L-shaped opening 224 aids the removal of BARC layer material in the spacer layer trench 2210 and 2220 and filling of the fill material 2240. In addition, because the fill material 2240 fills the spacer layer trench 2220 in the first line-shaped portion 2241, no dummy conductive line will be formed in that area as a result. In summary, embodiments of the method 100 provide benefits of forming functional conductive lines without the drawback of having dummy metal lines that have a length substantially identical to a pitch of gates of semiconductor devices in a standard cell. In addition, the embodiments of the method 100 provide large process window and increase process fidelity by forming an L-shaped opening in the second cut metal etch step.

In one exemplary aspect, the present disclosure is directed to a method of forming a semiconductor device. The method includes providing a workpiece having a substrate, a material layer over the substrate, and a hard mask layer over the material layer. The method further includes patterning the hard mask layer to form a first plurality of hard mask lines and forming a spacer material layer over the first plurality of hard mask lines, resulting in a second plurality of trenches defined by the spacer material layer, wherein the second plurality of trenches tracks the first plurality of hard mask lines. The method further includes forming an antireflective layer over the spacer material layer, including over the second plurality of trenches; forming an L-shaped opening in the antireflective layer, thereby exposing at least two of the second plurality of trenches; filling the L-shaped opening with a fill material; etching the spacer material layer to expose the first plurality of hard mask lines; and removing the first plurality of hard mask lines. After removing the first plurality of hard mask lines, the method further includes transferring a pattern of the spacer material layer and the fill material onto the material layer, resulting in trenches tracking the pattern; and filling the trenches with a conductive material.

In an embodiment of the method, the L-shaped opening includes a first line portion and a second line portion, and the second line portion extends from an end of the first line portion and is perpendicular to the first line portion. In a further embodiment, a width of the first line portion is greater than about a width of one of the second plurality of trenches and less than about a pitch of the first plurality of hard mask lines. In another further embodiment, the first line portion extends parallel to and is over one of the second plurality of trenches. In an embodiment, the second line portion extends across at least two of the second plurality of trenches.

In another embodiment of the method, the forming of the L-shaped opening in the antireflective layer comprises forming the L-shaped opening over more than one of the second plurality of trenches. In yet another embodiment, the removing of the first plurality of hard mask lines includes removing a portion of the first plurality of hard mask lines, thereby resulting in a leftover hard mask segment; and the transferring the pattern of the spacer material layer and fill material onto the material layer includes transferring a pattern of the leftover hard mask segment on the material layer.

In another exemplary aspect, the present disclosure is directed to a method of forming a semiconductor device. The method includes forming a first plurality of hard mask lines over a material layer on a substrate, the first plurality of hard mask lines extending along a first direction; and forming a spacer material layer over the first plurality of hard mask lines, resulting in a second plurality of trenches extending along the first direction, each of the second plurality of trenches having sidewalls formed of the spacer material layer, wherein the second plurality of trenches tracks the first plurality of hard mask lines. The method further includes forming a antireflective layer over the second plurality of trenches; forming a first line-shaped opening in the antireflective layer; filling the first line-shaped opening with a fill material, wherein the first line-shaped opening extends along the first direction; etching the spacer material layer to expose the first plurality of hard mask lines; and removing the first plurality of hard mask lines. After removing the first plurality of hard mask lines, the method further includes transferring a pattern of the spacer material layer and the fill material onto the material layer, resulting in trenches tracking the pattern; and filling the trenches with a conductive material.

In an embodiment, the method further includes forming a second line-shaped opening in the antireflective layer, wherein the second line-shaped opening extends from an end of the first line-shaped opening and along a second direction perpendicular to the first direction; and filling the second line-shaped opening with the fill material. In another embodiment, the first line-shaped opening extends over one of the second plurality of trenches. In a further embodiment, the second line-shaped opening extends across at least two of the second plurality of trenches.

In another embodiment, a width of the first line-shaped opening is greater than about a width of one of the second plurality of trenches of the second plurality of trenches and less than about a pitch of the first plurality of hard mask lines. In some embodiments, the forming of the first line-shaped opening in the antireflective layer comprises forming the first line-shaped opening over one of the second plurality of trenches. In some embodiments, the removing of the first plurality of hard mask lines includes removing a portion of the first plurality of hard mask lines, thereby resulting in a leftover hard mask segment, and the transferring the pattern of the spacer material layer and fill material onto the material layer includes transferring a pattern of the leftover hard mask segment on the material layer.

In yet another exemplary aspect, the present disclosure is directed to a method of forming a semiconductor device. The method includes providing a workpiece having a substrate, a material layer over the substrate, and a hard mask layer over the material layer; patterning the hard mask layer, thereby forming a first plurality of hard mask lines; forming a spacer material layer over the first plurality of hard mask lines, resulting in a second plurality of trenches that tracks the first plurality of hard mask lines; and forming a antireflective layer over the spacer material layer, including over the second plurality of trenches. The method further includes forming an L-shaped opening in the antireflective layer, wherein the L-shaped opening includes a first line portion and a second line portion perpendicular to the first line portion, wherein the first line portion extends parallel to and is over one of the second plurality of trenches. The method further includes filling the L-shaped opening with a fill material; etching the spacer material layer to expose the first plurality of hard mask lines; and removing the first plurality of hard mask lines. After removing the first plurality of hard mask lines, the method further includes transferring a pattern of the spacer material layer and the fill material onto the material layer, resulting in trenches tracking the pattern; and filling the trenches with a conductive material.

In an embodiment of the method, the second line portion extends from an end of the first line portion and is perpendicular to the first line portion. In another embodiment, the second line portion extends across at least two of the second plurality of trenches. In some embodiments, a width of the first line portion is greater than about a width of one of the second plurality of trenches of the second plurality of trenches and less than about a pitch of the first plurality of hard mask lines.

In some embodiments, the removing of the first plurality of hard mask lines includes removing a portion of the first plurality of hard mask lines, thereby resulting in a leftover hard mask segment, and the transferring the pattern of the spacer material layer and fill material onto the material layer includes transferring a pattern of the leftover hard mask segment on the material layer. In some embodiments, after the removing of the first plurality of hard mask lines, the fill material comprises a line-shaped portion that fills one of the second plurality of trenches.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a workpiece, the workpiece comprising:
a substrate,
a low-k dielectric layer over the substrate,
a first hard mask layer over the low-k dielectric layer,
an etch stop layer over the first hard mask layer, and
a second hard mask layer over the etch stop layer;
patterning the second hard mask layer to form a plurality of hard mask lines;
depositing a spacer material layer over top surfaces and sidewalls of the plurality of hard mask lines, resulting in a plurality of trenches;
depositing a bottom antireflective coating (BARC) layer using spin-on coating to cover the spacer material layer;
forming an L-shaped opening in the BARC layer to expose two of the plurality of trenches;
filling the L-shaped opening with a fill material;
planarizing the workpiece such that a top surface of the fill material, a top surface of the BARC layer, a top surface of the spacer material layer are coplanar; and
selectively removing the BARC layer, resulting in a first fill material feature in one of the two of the plurality of trenches and a second fill material feature in the other of the two of the plurality of trenches.

2. The method of claim 1,
wherein the plurality of trenches extends a direction,
wherein a length of the first fill material feature along the direction is smaller than a length of the second fill material feature along the direction.

3. The method of claim 1, wherein the selectively removing of the BARC layer does not substantially remove the fill material and the spacer material layer.

4. The method of claim 1, wherein the first fill material feature is separate from the second fill material feature.

5. The method of claim 1, further comprising:
etching the spacer material layer to expose the plurality of hard mask lines;
selectively removing the plurality of hard mask lines to form a pattern defined by the etched spacer material layer, the first fill material feature and the second fill material feature;
after selectively removing the plurality of hard mask lines, etching the low-k dielectric layer using the pattern as an etch mask to form conductive line trenches; and
filling the conductive line trenches with a conductive material to form a conductive line pattern.

6. The method of claim 5,
wherein the selective removing of the plurality of hard mask lines includes removing a portion of the plurality of hard mask lines, thereby resulting in a leftover hard mask segment,
wherein the leftover hard mask segment over the material layer is directly over a discontinuation in the conductive line pattern.

7. The method of claim 5, wherein the first fill material feature and the second fill material feature are directly over discontinuations in the conductive line pattern.

8. The method of claim 1,
wherein the L-shaped opening includes a first line portion and a second line portion,
wherein the second line portion extends from an end of the first line portion and is perpendicular to the first line portion.

9. The method of claim 8, wherein the second line portion extends across the two of the plurality of trenches.

10. A method, comprising:
receiving an integrated circuit (IC) design layout that includes a conductive line pattern, the conductive line pattern comprising a plurality of conductive line segments extending along a first direction;

determining, using a computer system, two adjacent conductive line segments of the plurality of conductive line segments that have respective terminal ends aligned along a second direction perpendicular to the first direction;

determining, using the computer system, a non-functional line portion of one of the two adjacent conductive line segments that is immediately adjacent one of the terminal ends;

identifying an L-shape pattern comprising a first line portion extending along the non-functional line portion and a second line portion extending between the terminal ends of the two adjacent conductive line segments; and performing a photolithography process to transfer the L-shape pattern to an antireflective layer.

11. The method of claim 10, wherein the performing of the photolithography process comprises:

forming a plurality of hard mask lines over a material layer over a substrate, the plurality of hard mask lines extending along the first direction;

forming a spacer material layer over the plurality of hard mask lines, resulting in a plurality of trenches extending along the first direction, each of the plurality of trenches having sidewalls formed of the spacer material layer;

forming the antireflective layer over the plurality of trenches; and transferring the L-shape pattern to the antireflective layer to form an L-shape opening in the antireflective layer.

12. The method of claim 11, wherein the transferring of the L-shape pattern comprises:

depositing a photoresist layer over the antireflective layer by spin-on coating;

patterning the photoresist layer to have an opening having a shape of the L-shape pattern, thereby forming a patterned photoresist layer; and etching the antireflective layer using the patterned photoresist layer.

13. The method of claim 11, wherein the performing of the photolithography process further comprises:

filling the L-shaped opening with a fill material, etching the spacer material layer to expose the plurality of hard mask lines;

removing the plurality of hard mask lines to form a pattern comprising the spacer material layer and the fill material;

after removing the plurality of hard mask lines, transferring the pattern onto the material layer, resulting in trenches tracking the pattern; and filling the trenches with a conductive material to form the conductive line pattern.

14. The method of claim 13, wherein the first line portion extends over one of the plurality of trenches.

15. The method of claim 13, wherein the second line portion extends across at least two of the plurality of trenches.

16. The method of claim 13, wherein the removing of the plurality of hard mask lines includes removing a portion of the plurality of hard mask lines, thereby resulting in a leftover hard mask segment, wherein the transferring the pattern of the spacer material layer and fill material onto the material layer includes transferring a pattern of the leftover hard mask segment on the material layer.

17. A method, comprising:

providing a workpiece, the workpiece comprising:
a substrate,
a low-k dielectric layer over the substrate,
an etch stop layer over low-k dielectric layer, and
a hard mask layer over the etch stop layer;

patterning the hard mask layer to form a plurality of hard mask lines on the etch stop layer;

etching one of the plurality of hard mask lines to form a discontinuation;

depositing a spacer material layer over the discontinuation, top surfaces and sidewalls of the plurality of hard mask lines, resulting in a plurality of trenches defined by the deposited spacer material layer;

depositing a bottom antireflective coating (BARC) layer using spin-on coating to cover the deposited spacer material layer;

forming an L-shaped opening in the BARC layer to expose two of the plurality of trenches;

filling the L-shaped opening with a fill material;

planarizing the workpiece such that a top surface of the fill material, a top surface of the BARC layer, a top surface of the spacer material layer are coplanar; and selectively removing the BARC layer, resulting in a first fill material feature in one of the two of the plurality of trenches and a second fill material feature in the other of the two of the plurality of trenches.

18. The method of claim 17, wherein the plurality of trenches extends a direction, wherein a length of the first fill material feature along the direction is smaller than a length of the second fill material feature along the direction.

19. The method of claim 17, further comprising:

etching the spacer material layer to expose the plurality of hard mask lines;

selectively removing the plurality of hard mask lines to form a pattern defined by the etched spacer material layer, the first fill material feature and the second fill material feature;

after selectively removing the plurality of hard mask lines, etching the low-k dielectric layer using the pattern as an etch mask to form conductive line trenches; and filling the conductive line trenches with a conductive material to form a conductive line pattern.

20. The method of claim 19, wherein the discontinuation is directly over a discontinuation in the conductive line pattern.

* * * * *